United States Patent
Copel

(10) Patent No.: US 10,970,624 B2
(45) Date of Patent: Apr. 6, 2021

(54) PRE-PROGRAMMED RESISTIVE CROSS-POINT ARRAY FOR NEURAL NETWORK

(71) Applicant: SAMSUNG ELECTRONICS CO., LTD., Suwon-si (KR)

(72) Inventor: Matthew W. Copel, Yorktown Heights, NY (US)

(73) Assignee: Samsung Electronics Co., Ltd., Suwon-si (KR)

(*) Notice: Subject to any disclaimer, the term of this patent is extended or adjusted under 35 U.S.C. 154(b) by 38 days.

(21) Appl. No.: 15/434,511

(22) Filed: Feb. 16, 2017

(65) Prior Publication Data

US 2018/0089559 A1  Mar. 29, 2018

Related U.S. Application Data

(62) Division of application No. 15/277,264, filed on Sep. 27, 2016, now Pat. No. 9,659,249.

(51) Int. Cl.
| | |
|---|---|
| *G06N 3/063* | (2006.01) |
| *G06N 3/04* | (2006.01) |
| *G06N 3/08* | (2006.01) |
| *H01L 45/00* | (2006.01) |
| *H01L 27/10* | (2006.01) |

(52) U.S. Cl.
CPC ............ *G06N 3/0635* (2013.01); *G06N 3/04* (2013.01); *G06N 3/08* (2013.01); *H01L 45/1233* (2013.01); *H01L 45/14* (2013.01); *H01L 45/1675* (2013.01); *G06N 3/084* (2013.01); *H01L 27/101* (2013.01)

(58) Field of Classification Search
CPC .................................. H01L 51/05; G06N 3/00
USPC ................... 257/253; 438/455, 754
See application file for complete search history.

(56) References Cited

U.S. PATENT DOCUMENTS

| | | | | |
|---|---|---|---|---|
| 5,300,799 | A * | 4/1994 | Nakamura | H01L 27/11502 257/295 |
| 5,519,812 | A * | 5/1996 | Ishihara | G06N 3/0635 706/33 |
| 6,117,643 | A * | 9/2000 | Simpson | C12Q 1/02 422/504 |
| 6,153,517 | A * | 11/2000 | Chuang | H01L 21/76843 257/E21.584 |
| 6,517,995 | B1 * | 2/2003 | Jacobson | B01J 19/0046 101/28 |
| 6,546,071 | B2 | 4/2003 | Graves | |
| 7,006,992 | B1 | 2/2006 | Packwood | |

(Continued)

OTHER PUBLICATIONS

List of IBM Patents or Patent Applications Treated as Related; (Appendix P), Filed Mar. 14, 2017; 2 pages.

(Continued)

*Primary Examiner* — Sheng-Bai Zhu
(74) *Attorney, Agent, or Firm* — NSIP Law

(57) ABSTRACT

Technical solutions are described for forming a semiconductor device for a crosspoint array that implements a pre-programmed neural network. An example method includes sequentially depositing a semiconducting layer, a top insulating layer, and a shunting layer onto a base insulating layer. The method further includes etching selective portions of the top insulating layer corresponding to resistance values associated with weights of the crossbar that implements the neural network.

9 Claims, 13 Drawing Sheets

(56) References Cited

U.S. PATENT DOCUMENTS

| | | | |
|---|---|---|---|
| 8,000,161 B2 | 8/2011 | Stan et al. | |
| 2003/0122175 A1* | 7/2003 | Buskirk | H01L 23/5223 257/310 |
| 2006/0033128 A1* | 2/2006 | Chi | H01L 21/84 257/279 |
| 2007/0249071 A1 | 10/2007 | Lian et al. | |
| 2008/0061323 A1* | 3/2008 | Yazawa | G01N 27/414 257/253 |
| 2010/0001267 A1* | 1/2010 | Manning | H01L 45/1675 257/40 |
| 2010/0051906 A1* | 3/2010 | Yamauchi | H01L 27/14645 257/21 |
| 2012/0107999 A1* | 5/2012 | Fan | H01L 27/14643 438/73 |

OTHER PUBLICATIONS

Matthew W. Copel, "Pre-Programmed Resistive Cross-Point Array for Neural Network", U.S. Appl. No. 15/277,264, filed Sep. 27, 2016.

Chang et al, "Building Neuromorphic Circuits with Memristive Devices", IEEE Circuits and Systems Magazine, 2013, pp. 1-18.
Chi et al, "PRIME: A Novel Processing-In-Memory Architecture for Neural Network Computation in ReRAM-based Main Memory", Proceedings of ISCA, vol. 43, 2016, pp. 1-13.
Chua, Leon "Resistance switching memories are memristors" Appl. Phys A (2001) pp. 765-783.
Gu et al, "Technological Exploration of RRAM Crossbar Array for Matrix-Vector Multiplication", The 20th Asia and South Pacific Design Automation Conference. IEEE, 2015, pp. 1-6.
Jain et al., "Artificial Neural Networks: A Tutorial", IEEE, Mar. 1996, pp. 31-44.
Serb et al., "Limitations and precision requirements for read-out of passive, linear, selectorless RRAM arrays", IEEE International Symposium on Circuits and Systems (ISCAS), 2015, pp. 1-4.
Soudry et al., "Memristor-Based Multilayer Neural Networks With Online Gradient Descent Training", IEEE Transactions on Neural Networks and Learning Systems; 2015 IEEE, 14 pgs.
Wong et al, "Metal-oxide RRAM", Proceedings of the IEEE, vol. 100.6, Jun. 2012, pp. 1951-1970.
Yang et al., "Memristive Devices: Switching Effects, Modeling, and Applications", Memristors and Memristive Systems. Springer New York, 2014, pp. 1-27.

* cited by examiner f(x) = f (INPUT 1 * CONNECTION STRENGTH 1 + INPUT 2 * CONNECTION STRENGTH 2)

$$i = g(s,v)v \qquad \text{EQUATION [1]}$$

$$\frac{\partial s(t)}{\partial t} = f(s,v) \qquad \text{EQUATION [2]}$$

PRE-PROGRAMMED RESISTIVE CROSS-POINT ARRAY FOR NEURAL NETWORK

PRIORITY

This application is a divisional of and claims priority from U.S. patent application Ser. No. 15/277,264, filed on Sep. 27, 2016, entitled "PRE-PROGRAMMED RESISTIVE CROSS-POINT ARRAY FOR NEURAL NETWORK", the entire contents of which are incorporated herein by reference.

BACKGROUND

The present invention relates in general to semiconductor device fabrication methods and resulting structures. More specifically, the present invention relates to fabrication methods and resulting structures for a semiconductor device for artificial neural networks (ANNs) formed from crossbar arrays of two-terminal resistive processing units (RPUs) that provide local data storage and local data processing without the need for additional processing elements beyond the two-terminal RPU, thereby accelerating the ANN's ability implement algorithms such as matrix inversion, matrix decomposition and the like.

"Machine learning" is used to broadly describe a primary function of electronic systems that learn from data. In machine learning and cognitive science, ANNs are a family of statistical learning models inspired by the biological neural networks of animals, and in particular the brain. ANNs can be used to estimate or approximate systems and functions that depend on a large number of inputs and are generally unknown. Crossbar arrays are high density, low cost circuit architectures used to form a variety of electronic circuits and devices, including ANN architectures, neuromorphic microchips and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which can be formed from thin film material.

SUMMARY

According to one or more embodiments, an example method for forming a semiconductor device for a crosspoint array that implements a pre-programmed neural network is described. The method includes sequentially depositing a semiconducting layer, a top insulating layer, and a shunting layer onto a base insulating layer. The method further includes etching selective portions of the top insulating layer corresponding to resistance values associated with weights of the crossbar that implements the neural network.

According to one or more embodiments, a semiconductor device for a crosspoint device from a crosspoint array is described. The semiconductor device is formed using a method that includes depositing a semiconducting layer on a base insulating layer. The method further includes depositing a top insulating layer on the semiconducting layer. The method further includes removing a portion of the top insulating layer. The method further includes depositing a shunting layer on the top insulating layer, wherein the shunting layer contacts the semiconducting layer via the portion that is removed from the top insulating layer, wherein the dimensions of the portion determine a resistance value of the crosspoint device.

According to one or more embodiments, a semiconductor device that implements a pre-programmed neural network includes a semiconducting layer deposited on a base insulating layer. The semiconductor device further includes a top insulating layer deposited on the semiconducting layer. The semiconductor device further includes a portion of the top insulating layer removed. The semiconductor device further includes a shunting layer deposited on the top insulating layer, wherein the shunting layer contacts the semiconducting layer via the portion that is removed from the top insulating layer, wherein the dimensions of the portion determine a resistance value of the semiconductor device.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

DETAILED DESCRIPTION

Figure 1:
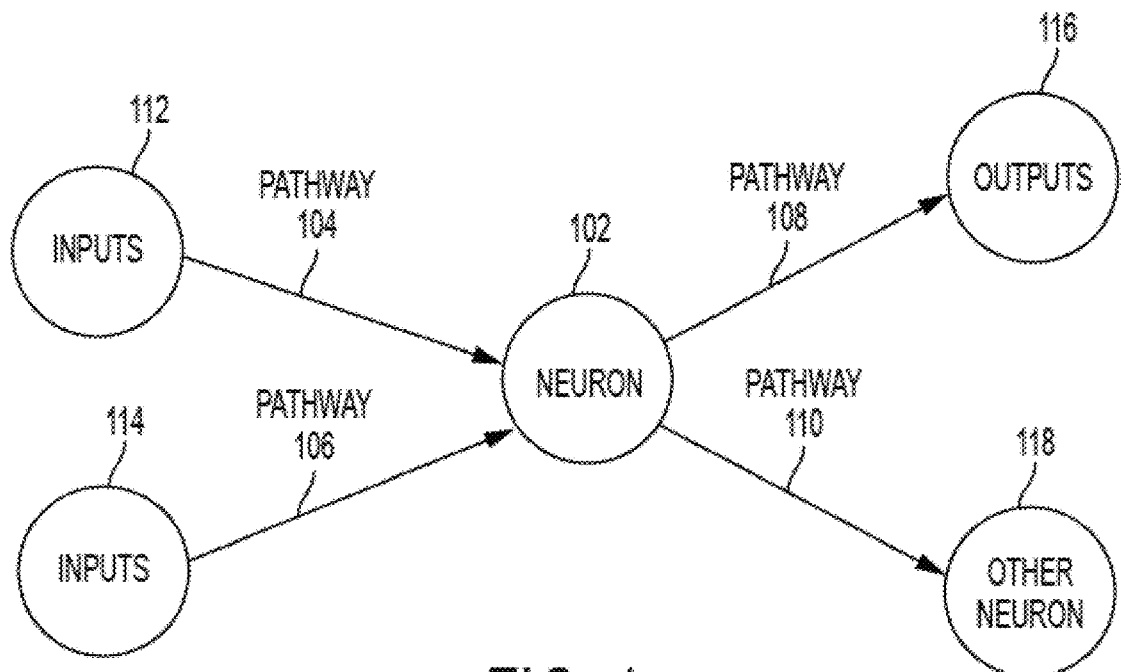
FIG. 1 depicts a simplified diagram of input and output connections of a biological neuron.

It is understood in advance that although one or more embodiments are described in the context of biological neural networks with a specific emphasis on modeling brain structures and functions, implementation of the teachings recited herein are not limited to modeling a particular environment. Rather, embodiments of the present invention are capable of modeling any type of environment, including for example, weather patterns, arbitrary data collected from the internet, and the like, as long as the various inputs to the environment can be turned into a vector.

ANNs are often embodied as so-called "neuromorphic" systems of interconnected processor elements that act as simulated "neurons" and exchange "messages" between each other in the form of electronic signals. Similar to the so-called "plasticity" of synaptic neurotransmitter connections that carry messages between biological neurons, the connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, an ANN for handwriting recognition is defined by a set of input neurons which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read.

Crossbar arrays, also known as crosspoint arrays or crosswire arrays, are high density, low cost circuit architectures used to form a variety of electronic circuits and devices, including ANN architectures, neuromorphic microchips and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which can be formed from thin film material.

Crosspoint devices, in effect, function as the ANN's weighted connections between neurons. Nanoscale two-terminal devices, for example memristors having "ideal" conduction state switching characteristics, are often used as the crosspoint devices in order to emulate synaptic plasticity with high energy efficiency. The conduction state (e.g., resistance) of the ideal memristor material can be altered by controlling the voltages applied between individual wires of the row and column wires. Digital data can be stored by alteration of the memristor material's conduction state at the intersection to achieve a high conduction state or a low conduction state. The memristor material can also be programmed to maintain two or more distinct conduction states by selectively setting the conduction state of the material. The conduction state of the memristor material can be read by applying a voltage across the material and measuring the current that passes through the target crosspoint device.

In order to limit power consumption, the crosspoint devices of ANN chip architectures are often designed to utilize offline learning techniques, wherein the approximation of the target function does not change once the initial training phase has been resolved. Offline learning allows the crosspoint devices of crossbar-type ANN architectures to be simplified such that they draw very little power.

Notwithstanding the potential for lower power consumption, executing offline training can be difficult and resource intensive because it is typically necessary during training to modify a significant number of adjustable parameters (e.g., weights) in the ANN model to match the input-output pairs for the training data. Accordingly, simplifying the crosspoint devices of ANN architectures to prioritize power-saving, offline learning techniques typically means that training speed and training efficiency are not optimized.

Providing simple crosspoint devices that keep power consumption within an acceptable range, as well as accelerate the speed and efficiency of training ANN architectures, would improve overall ANN performance and allow a broader range of ANN applications. Accordingly, described herein are technical solutions that facilitate training crosspoint arrays using resistive devices that facilitate storing output for each node at each crosspoint device. The devices are read-only devices.

Although embodiments described herein are directed to electronic systems, for ease of reference and explanation various aspects of the electronic systems are described using neurological terminology such as neurons, plasticity and synapses, for example. It will be understood that for any discussion or illustration herein of an electronic system, the use of neurological terminology or neurological shorthand notations are for ease of reference and are meant to cover the neuromorphic, ANN equivalent(s) of the described neurological function or neurological component.

ANNs, also known as neuromorphic or synaptronic systems, are computational systems that can estimate or approximate other functions or systems, including, for example, biological neural systems, the human brain and brain-like functionality such as image recognition, speech recognition and the like. ANNs incorporate knowledge from a variety of disciplines, including neurophysiology, cognitive science/psychology, physics (statistical mechanics), control theory, computer science, artificial intelligence, statistics/mathematics, pattern recognition, computer vision, parallel processing and hardware (e.g., digital/analog/VLSI/optical).

Instead of utilizing the traditional digital model of manipulating zeros and ones, ANNs create connections between processing elements that are substantially the functional equivalent of the core system functionality that is being estimated or approximated. For example, IBM™'s SyNapse™ computer chip is the central component of an electronic neuromorphic machine that attempts to provide similar form, function and architecture to the mammalian brain. Although the IBM SyNapse computer chip uses the same basic transistor components as conventional computer chips, its transistors are configured to mimic the behavior of neurons and their synapse connections. The IBM SyNapse computer chip processes information using a network of just over one million simulated "neurons," which communicate with one another using electrical spikes similar to the synaptic communications between biological neurons. The IBM SyNapse architecture includes a configuration of processors (i.e., simulated "neurons") that read a memory (i.e., a simulated "synapse") and perform simple operations. The communications between these processors, which are typically located in different cores, are performed by on-chip network routers.

Figure 2:
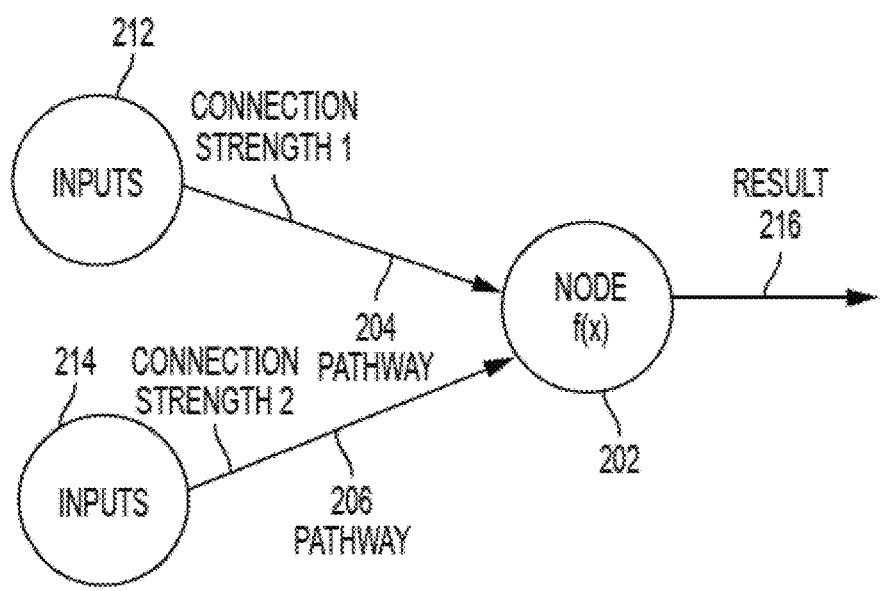
FIG. 2 depicts a known simplified model of the biological neuron shown in FIG. 1.
Figure 3:
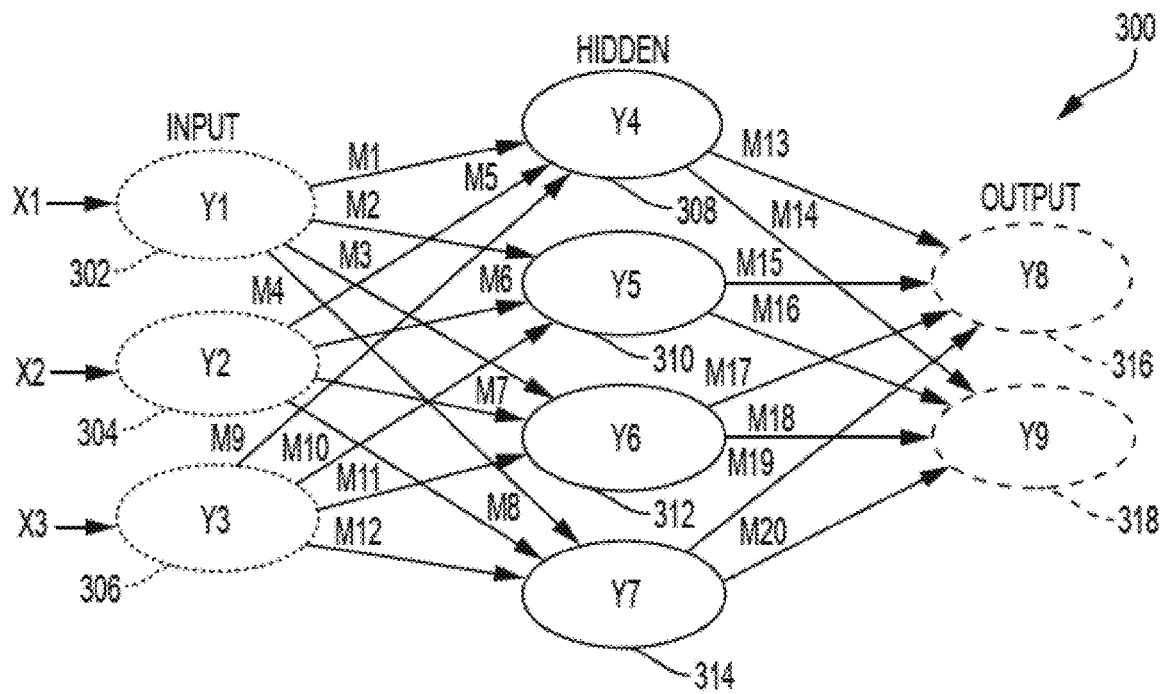
FIG. 3 depicts a known simplified model of an ANN incorporating the biological neuron model shown in FIG. 2.

A general description of how a typical ANN operates will now be provided with reference to FIGS. 1, 2 and 3. As previously noted herein, a typical ANN models the human brain, which includes about one hundred billion interconnected cells called neurons. FIG. 1 depicts a simplified diagram of a biological neuron 102 having pathways 104, 106, 108, 110 that connect it to upstream inputs 112, 114, downstream output s116 and downstream "other" neurons 118, configured and arranged as shown. Each biological neuron 102 sends and receives electrical impulses through pathways 104, 106, 108, 110. The nature of these electrical impulses and how they are processed in biological neuron 102 are primarily responsible for overall brain functionality. The pathway connections between biological neurons can be strong or weak. When a given neuron receives input impulses, the neuron processes the input according to the neuron's function and sends the result of the function to downstream outputs and/or downstream "other" neurons.

Biological neuron 102 is modeled in FIG. 2 as a node 202 having a mathematical function, f(x) depicted by the equation shown in FIG. 2. Node 202 takes electrical signals from inputs 212, 214, multiplies each input 212, 214 by the strength of its respective connection pathway 204, 206, takes a sum of the inputs, passes the sum through a function, f(x), and generates a result 216, which can be a final output or an input to another node, or both. In the present description, an asterisk (*) is used to represent a multiplication. Weak input signals are multiplied by a very small connection strength number, so the impact of a weak input signal on the function is very low. Similarly, strong input signals are multiplied by a higher connection strength number, so the impact of a strong input signal on the function is larger. The function f(x) is a design choice, and a variety of functions can be used. A typical design choice for f(x) is the hyperbolic tangent function, which takes the function of the previous sum and outputs a number between minus one and plus one.

FIG. 3 depicts a simplified ANN model 300 organized as a weighted directional graph, wherein the artificial neurons are nodes (e.g., 302, 308, 316), and wherein weighted directed edges (e.g., m1 to m20) connect the nodes. ANN model 300 is organized such that nodes 302, 304, 306 are input layer nodes, nodes 308, 310, 312, 314 are hidden layer nodes and nodes 316, 318 are output layer nodes. Each node is connected to every node in the adjacent layer by connection pathways, which are depicted in FIG. 3 as directional arrows having connection strengths m1 to m20. Although only one input layer, one hidden layer and one output layer are shown, in practice, multiple input layers, hidden layers and output layers can be provided.

Similar to the functionality of a human brain, each input layer node 302, 304, 306 of ANN 300 receives inputs x1, x2, x3 directly from a source (not shown) with no connection strength adjustments and no node summations. Accordingly, y1=f(x1), y2=f(x2) and y3=f(x3), as shown by the equations listed at the bottom of FIG. 3. Each hidden layer node 308, 310, 312, 314 receives its inputs from all input layer nodes 302, 304, 306 according to the connection strengths associated with the relevant connection pathways. Thus, in hidden layer node 308, y4=f(m1*y1+m5*y2+m9*y3), wherein * represents a multiplication. A similar connection strength multiplication and node summation is performed for hidden layer nodes 310, 312, 314 and output layer nodes 316, 318, as shown by the equations defining functions y5 to y9 depicted at the bottom of FIG. 3.

ANN model 300 processes data records one at a time, and it "learns" by comparing an initially arbitrary classification of the record with the known actual classification of the record. Using a training methodology knows as "backpropagation" (i.e., "backward propagation of errors"), the errors from the initial classification of the first record are fed back into the network and used to modify the network's weighted connections the second time around, and this feedback process continues for many iterations. In the training phase of an ANN, the correct classification for each record is known, and the output nodes can therefore be assigned "correct" values. For example, a node value of "1" (or 0.9) for the node corresponding to the correct class, and a node value of "0" (or 0.1) for the others. It is thus possible to compare the network's calculated values for the output nodes to these "correct" values, and to calculate an error term for each node (i.e., the "delta" rule). These error terms are then used to adjust the weights in the hidden layers so that in the next iteration the output values will be closer to the "correct" values.

There are many types of neural networks, but the two broadest categories are feed-forward and feedback/recurrent networks. ANN model 300 is a non-recurrent feed-forward network having inputs, outputs and hidden layers. The signals can only travel in one direction. Input data is passed onto a layer of processing elements that perform calculations. Each processing element makes its computation based upon a weighted sum of its inputs. The new calculated values then become the new input values that feed the next layer. This process continues until it has gone through all the layers and determined the output. A threshold transfer function is sometimes used to quantify the output of a neuron in the output layer.

A feedback/recurrent network includes feedback paths, which mean that the signals can travel in both directions using loops. All possible connections between nodes are allowed. Because loops are present in this type of network, under certain operations, it can become a non-linear dynamical system that changes continuously until it reaches a state of equilibrium. Feedback networks are often used in associative memories and optimization problems, wherein the network looks for the best arrangement of interconnected factors.

The speed and efficiency of machine learning in feed-forward and recurrent ANN architectures depend on how effectively the crosspoint devices of the ANN crossbar array perform the core operations of typical machine learning algorithms. Although a precise definition of machine learning is difficult to formulate, a learning process in the ANN context can be viewed as the problem of updating the crosspoint device connection weights so that a network can efficiently perform a specific task. The crosspoint devices typically learn the necessary connection weights from available training patterns. Performance is improved over time by iteratively updating the weights in the network. Instead of following a set of rules specified by human experts, ANNs "learn" underlying rules (like input-output relationships) from the given collection of representative examples. Accordingly, a learning algorithm can be generally defined as the procedure by which learning rules are used to update and/or adjust the relevant weights.

The three main learning algorithm paradigms are supervised, unsupervised and hybrid. In supervised learning, or learning with a "teacher," the network is provided with a correct answer (output) for every input pattern. Weights are determined to allow the network to produce answers as close as possible to the known correct answers. Reinforcement learning is a variant of supervised learning in which the network is provided with only a critique on the correctness of network outputs, not the correct answers themselves. In contrast, unsupervised learning, or learning without a teacher, does not require a correct answer associated with each input pattern in the training data set. It explores the underlying structure in the data, or correlations between patterns in the data, and organizes patterns into categories from these correlations. Hybrid learning combines supervised and unsupervised learning. Parts of the weights are usually determined through supervised learning, while the others are obtained through unsupervised learning. Additional details of ANNs and learning rules are described in Artificial Neural Networks: A Tutorial, by Anil K. Jain, Jianchang Mao and K. M. Mohiuddin, IEEE, March 1996, the entire description of which is incorporated by reference herein.

As previously noted herein, in order to limit power consumption, the crosspoint devices of ANN chip architectures are often designed to utilize offline learning techniques, wherein the approximation of the target function does not change once the initial training phase has been resolved. Offline learning allows the crosspoint devices of crossbar-type ANN architectures to be simplified such that they draw very little power.

Figure 4:
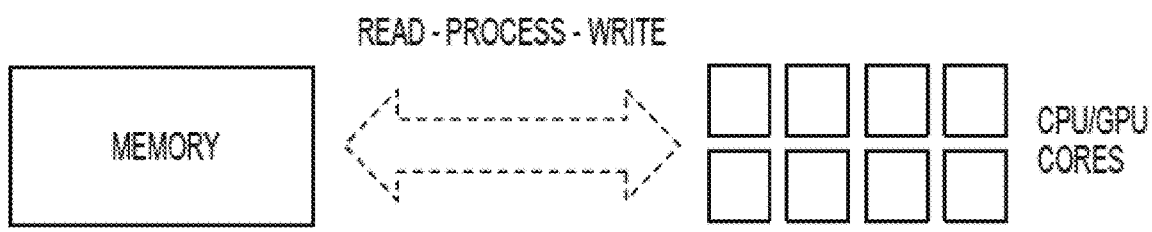
FIG. 4 depicts a simplified block diagram of a known weight update methodology.

Notwithstanding the potential for lower power consumption, executing offline training can be difficult and resource intensive because it is typically necessary during training to modify a significant number of adjustable parameters (e.g., weights) in the ANN model to match the input-output pairs for the training data. FIG. 4 depicts a simplified illustration of a typical read-process-write weight update operation, wherein CPU/GPU cores (i.e., simulated "neurons") read a memory (i.e., a simulated "synapse") and perform weight update processing operations, then write the updated weights back to memory. Accordingly, simplifying the crosspoint devices of ANN architectures to prioritize power-saving, offline learning techniques typically means that training speed and training efficiency are not optimized.

Figure 5:
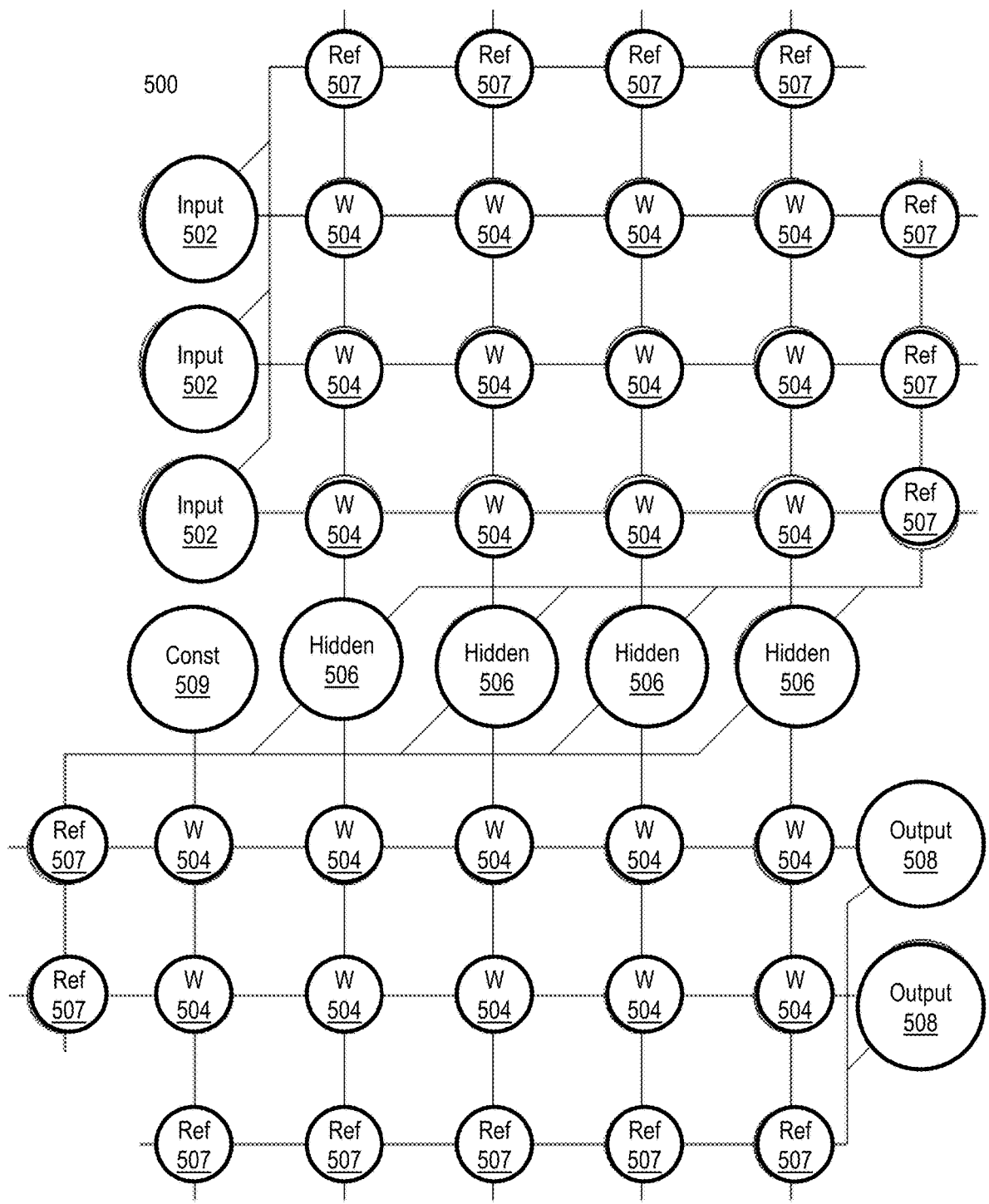
FIG. 5 is a diagram of an ANN including arrays of weights in accordance with the one or more embodiments.

FIG. 5 illustrates an artificial neural network (ANN) architecture 500. During feed-forward operation, a set of input neurons 502 each provide an input voltage in parallel to a respective row of weights 504. A weight 504 can be any nonvolatile memory such as EEPROM, ReRAM, PCM, or the like. The weights 504 each have a settable resistance value, such that a current output flows from the weight 504 to a respective hidden neuron 506 to represent the weighted input. The current output by a given weight is determined as $$I = \frac{V}{r},$$

where V is the input voltage from the input neuron 502 and r is the set resistance of the weight 504. The current from each weight adds column-wise and flows to a hidden neuron 506. A set of reference weights 507 have a fixed resistance and combine their outputs into a reference current that is provided to each of the hidden neurons 506. Because conductance values can only be positive numbers, some reference conductance is needed to encode both positive and negative values in the matrix. The currents produced by the weights 504 are continuously valued and positive, and therefore the reference weights 507 are used to provide a reference current, above which currents are considered to have positive values and below which currents are considered to have negative values.

As an alternative to using the reference weights 507, another embodiment can use separate arrays of weights 504 to capture negative values. Each approach has advantages and disadvantages. Using the reference weights 507 is more efficient in chip area, but reference values need to be matched closely to one another. In contrast, the use of a separate array for negative values does not involve close matching as each value has a pair of weights to compare against. However, the negative weight matrix approach uses roughly twice the chip area as compared to the single reference weight column. In addition, the reference weight column generates a current that needs to be copied to each neuron for comparison, whereas a negative matrix array provides a reference value directly for each neuron. In the negative array embodiment, the weights 504 of both positive and negative arrays are updated, but this also increases signal-to-noise ratio as each weight value is a difference of two conductance values. The two embodiments provide identical functionality in encoding a negative value and those having ordinary skill in the art will be able to choose a suitable embodiment for the application at hand.

The hidden neurons 506 use the currents from the array of weights 504 and the reference weights 507 to perform some calculation. The hidden neurons 506 then output a voltage of their own to another array of weights 507. This array performs in the same way, with a column of weights 504 receiving a voltage from their respective hidden neuron 506 to produce a weighted current output that adds row-wise and is provided to the output neuron 508.

It should be understood that any number of these stages can be implemented, by interposing additional layers of arrays and hidden neurons 506. It should also be noted that some neurons can be constant neurons 509, which provide a constant voltage to the array. The constant neurons 509 can be present among the input neurons 502 and/or hidden neurons 506 and are only used during feed-forward operation.

During back propagation, the output neurons 508 provide a voltage back across the array of weights 504. The output layer compares the generated network response to training data and computes an error. The error is applied to the array as a voltage pulse, where the height and/or duration of the pulse is modulated proportional to the error value. In this example, a row of weights 504 receives a voltage from a respective output neuron 508 in parallel and converts that voltage into a current which adds column-wise to provide an input to hidden neurons 506. The hidden neurons 506 provide combine the weighted feedback signal with a derivative of its feed-forward calculation and stores an error value before outputting a feedback signal voltage to its respective column of weights 504. This back propagation travels through the entire network 500 until all hidden neurons 506 and the input neurons 502 have stored an error value.

During weight updates, the input neurons 502 and hidden neurons 506 apply a first weight update voltage forward and the output neurons 508 and hidden neurons 506 apply a second weight update voltage backward through the network 500. The combinations of these voltages create a state change within each weight 504, causing the weight 504 to take on a new resistance value. In this manner, the weights 504 can be trained to adapt the neural network 500 to errors in its processing. It should be noted that the three modes of operation, feed forward, back propagation, and weight update, do not overlap with one another.

As previously noted herein, in order to limit power consumption, the crosspoint devices of ANN chip architectures are often designed to utilize offline learning techniques, wherein the approximation of the target function does not change once the initial training phase has been resolved. Offline learning allows the crosspoint devices of crossbar-type ANN architectures to be simplified such that they draw very little power.

Turning now to an overview of the present invention, one or more embodiments are directed to a two-terminal programmable resistive crosspoint component referred to herein as a resistive processing unit (RPU), which provides local data storage functionality and local data processing functionality. In other words, when performing data processing, the value stored at each RPU is permanently stored, which eliminate the need to move relevant data in and out of a processor and a separate storage element. Additionally, the local data storage and local data processing provided by the described two-terminal RPUs accelerate the ANN's ability to implement algorithms such as matrix inversion, matrix decomposition and the like. Accordingly, implementing a machine learning ANN architecture having the described RPU enables the implementation that optimize the speed, efficiency and power consumption of the ANN. The described RPU and resulting ANN architecture improve overall ANN performance and enable a broader range of practical ANN applications.

The term "memristor" is used to describe a passive two-terminal electrical component, wherein the resistance value of the device depends on the history of the voltages that have previously been applied to the device. The operation of a memristor is governed by Equations [1] and [2] shown in FIG. 6A, wherein i is the current passing through the device, v is the voltage applied to the device, g is the conductance value of the device (which is the inverse of the resistance), s is the internal state variable of the device that controls the conductance value and f is the function that shows the time evolution of the internal state variable s. In a publication by Chua, L. O., titled "Resistance Switching Memories are Memristors," Applied Physics A (2011), 102 (4): 765-783, memristor functionality is proposed for the operation of resistive memory devices such as resistive random-access-memory (RRAM), phase change memory (PCM) and conductive-bridging random-access-memory (CBRAM). Because a memristor device remembers its history (i.e., the so-called "non-volatility property"), the Chua article proposes such devices as possible alternatives for non-volatile memory technologies.

Figures 6A, 6B:
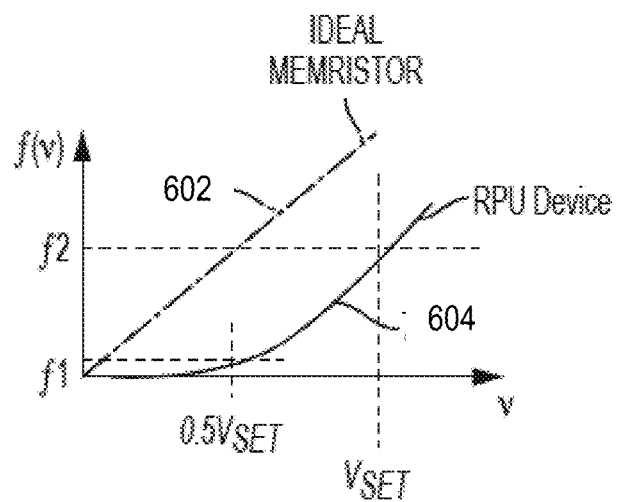
FIG. 6A depicts known equations that govern the operation of a passive, two-terminal memristor.
FIG. 6B depicts a graphical comparison between the linear switching characteristic of a known two-terminal memristor and the non-linear switching characteristic of a two-terminal RPU according to embodiments of the present invention.

A publication by D. Soudry et al., titled "Memristor-Based Multilayer Neural Networks With Online Gradient Descent Training," IEEE Transactions On Neural Networks and Learning Systems (2015), proposes the use of memristors for back-propagating neural network training hardware. However, the Soudry et al article assumes an ideal memristor operation, wherein the change in resistance is linear with respect to the voltage applied to the device. The Soudry et al. design assumed that the function f(s,v) in Equation [2] of FIG. 6A is a simple function given by the relationship f(s,v)=v. The Soudry et al. article proposes an architecture that is similar to a 2D systolic array as described above, wherein each crosspoint is implemented with an ideal memristor and a pair of transistors. In the Soudry et al. article, the memristor is in effect used to store the weight value, and the pair of transistors is used to compute a local multiplication operation that is needed for the weight updates, wherein the result of the weight update modifies the memristor's conduction state. The Soudry et al. article describes, in effect, a four terminal device composed of a memristor and two transistors, which are used to make a 2D array of the 4 terminal devices in order to implement the back-propagation training of the neural network hardware.

Turning now to a more detailed description of the present invention, one or more embodiments are directed to two-terminal RPUs, which provide local data storage functionality and local data processing functionality without the necessity of extra circuit elements such as transistors and off-chip storage and/or processing components. The described RPU can be implemented as any device that has a non-linear switching characteristic, including but not limited to RRAM, PCM, CBRAM, non-linear memristive systems, and the like.

When implementing the described RPU device as a memristive system, it is important that the memristor is non-ideal with a non-linear switching characteristic. In an ideal memristor, the change in resistance is linearly proportional to the voltage applied to the ideal memristor device. Accordingly, as soon as an ideal memristor device experiences any voltage its resistance state changes. However, for described RPU devices implemented as non-ideal, non-linear memristive systems, there is a well-defined "SET" voltage, VSET, (which is characteristics of the device), and the memristive RPU device would need to experience a voltage V>VSET in order to change its internal resistance state. For such devices, a half bias application of a voltage V=0.5VSET does not cause any change in the internal resistance state.

To further illustrate the difference between an ideal memristor and a non-ideal, non-linear memristor that can be used to implement the described RPU, FIG. 6B is a graph illustrating a comparison between the voltage switching behaviors of an ideal memristor and an RPU in accordance with embodiments of the present invention. The vertical axis represents device state change at a particular voltage, and the horizontal axis represents the voltage applied. In an ideal memristor operation, a change in resistance is linearly proportional to the voltage applied to the device. Thus, as soon as the memristor sees any voltage, its resistance state changed. This is shown by curve 602, which shows that the change in state is dramatic even at low voltages.

For non-linear RPU devices as shown by the curve 604, there is a well-defined set voltage, VSET, that the device needs to experience in order to change its internal resistance state. A bias voltage of 0.5VSET will not change the internal resistance state. In embodiments of the present invention, this non-linear characteristic of the RPU device is exploited to perform multiplication locally. Assuming f1 is small, the device will not change its internal state when only 0.5VSET is applied. Notably, FIG. 6B illustrates positive voltages and positive changes to the resistive state of the RPU device, however, a similar relationship between negative voltages and negative resistance changes also exists.

Figure 6C:
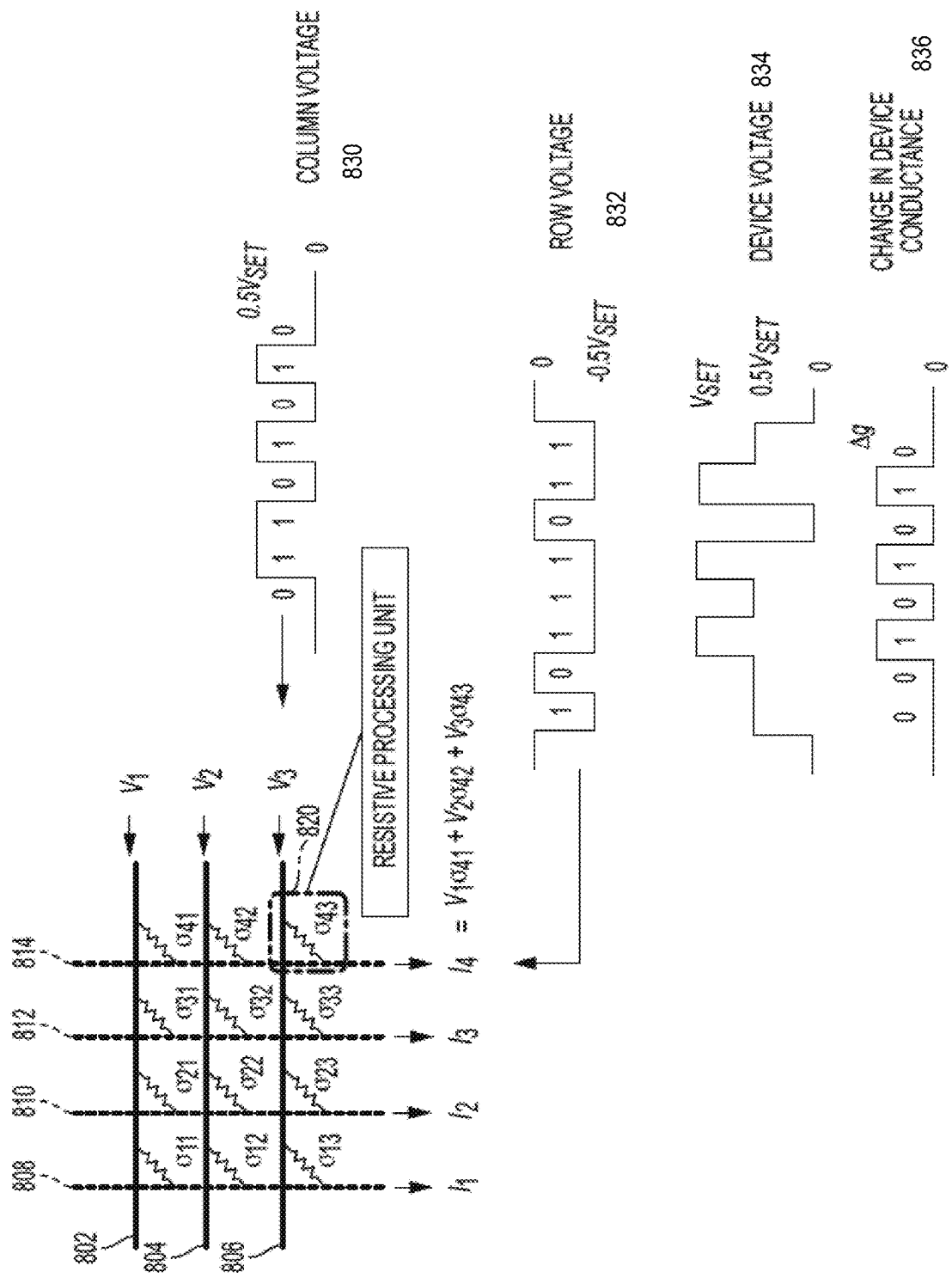
FIG. 6C depicts a cross bar array of two-terminal, non-linear RPU devices according to embodiments of the present invention, along with voltage sequences illustrating the operation of the RPU.

FIG. 6C depicts a cross bar array of two-terminal, non-linear RPU devices according to embodiments of the present invention, along with voltage sequences illustrating the operation of the RPU. FIG. 6C is a diagram of a two-dimensional (2D) crossbar array 800 that performs forward matrix multiplication, backward matrix multiplication and weight updates according to embodiments of the present invention. Crossbar array 800 is formed from a set of conductive row wires 802, 804, 806 and a set of conductive column wires 808, 810, 812, and 814 that intersect the set of conductive row wires 802, 804, and 806. The intersections between the set of row wires and the set of column wires are separated by RPUs, which are shown in FIG. 6C as resistive elements each having its own adjustable/updateable resistive weight, depicted as σ11, σ21, σ31, 641, σ12, σ22, σ32, σ42, σ13, σ23, σ33 and σ43, respectively. For ease of illustration, only one RPU 820 is labeled with a reference number in FIG. 6C. In forward matrix multiplication, the conduction state (i.e., the stored weights) of the RPU can be read by applying a voltage across the RPU and measuring the current that passes through the RPU.

Input voltages V1, V2, V3 are applied to row wires 802, 804, 806, respectively. Each column wire 808, 810, 812, 814 sums the currents I1, I2, I3, I4 generated by each RPU along the particular column wire. For example, as shown in FIG. 6C, the current I4 generated by column wire 814 is according to the equation I4=V1σ41+V2σ42+V3σ43. Thus, array 800 computes the forward matrix multiplication by multiplying the values stored in the RPUs by the row wire inputs, which are defined by voltages V1, V2, V3. The backward matrix multiplication is very similar. In backward matrix multiplication, voltages are applied at column wires 808, 810, 812, 814 then read from row wires 802, 804, 806. For weight updates, which are described in greater detail below, voltages are applied to column wires and row wires at the same time, and the conductance values stored in the relevant RPU devices all update in parallel. Accordingly, the multiplication and addition operations required to perform weight updates are performed locally at each RPU 820 of array 800 using the RPU device itself plus the relevant row or column wire of array 800. Thus, in accordance with embodiments of the present invention, no read-update-write cycles (shown in FIG. 4) are required in array 800.

Continuing with the diagram of FIG. 6C, in accordance with one or more embodiments, the operation of a positive weight update methodology for RPU 820 and its corresponding weight σ33 at the intersection of conductive row wire 806 and conductive column wire 812 will now be provided. The non-linear characteristics of RPU 820 are used to perform multiplication operations locally at RPU 820 using stochastic computing as described below. More specifically, the described methodology uses the non-linear switching characteristics of RPU 820 and stochastic bit streams 830, 832 to perform multiplication operations and the necessary weight updates locally at RPU 820 without the necessity of other circuit elements. Update generator circuitry (not shown) is provided at the periphery of crossbar array 800 and used as a peripheral "translator" in order to generate necessary voltage pulses in the form of stochastic bit streams (e.g., 830, 832) that would be applied to all RPUs of 2D crossbar array 800 in parallel.

Referring briefly to the diagram of FIG. 6B, it is assumed that f1 for RPU 820 shown in FIG. 6C is very small (e.g., f1=0) which means that RPU 820 does not change its internal state when only 0.5VSET is applied to it. A row voltage sequence or bit stream 830, which is applied to row wire 806, is shown as a sequence of voltage pulses representing weight updates having a voltage of zero or a voltage of +0.5VSET. A column voltage sequence or bit stream 832, which is applied to column wire 814, is shown as a sequence of voltage pulses also representing weight updates having either a voltage of zero or a voltage of −0.5VSET. In example of FIG. 6C, ⅘ is encoded by row voltage sequence 832, and ⅝ is encoded by column voltage sequence 830. The example voltage sequences 830, 832 represent a positive resistance change phase of the weight update. After the positive weight updates are performed, a separate set of sequences with the polarity of the respective voltages reversed can be used to update weights in a negative direction for those weights that need such correction.

Voltage sequence 834 is the voltages applied to RPU 820 resulting from the difference between row voltage sequence 830 and column voltage sequence 832. Voltage sequence 834 will have 3 voltage steps at 0V, 0.5VSET and VSET. However, because the resistance σ43 of RPU 820 only changes for device voltages reaching VSET, a single pulse either send through a column wire or a row wire is not enough to change the resistance state of RPU 820. When a column wire sends a voltage at 0.5VSET, and a row wire sends a voltage at −0.5VSET, the resulting VSET pulse applied to the relevant RPU will cause an incremental change in the resistance of the device. Accordingly, the voltage pulses applied to RPU 820 utilize the non-linear switching characteristic of RPU 820 in order to perform a bit wise stochastic AND operation locally at RPU 820. Hence, the resulting change in the stored weight (e.g., σ43) of the RPU is proportional to the product of the two numbers (⅘*⅝=⅜) "translated" by update generator circuitry, which is peripheral to crossbar array 800.

Accordingly, referring to the ANN implemented using a crosspoint array including RPUs as described herein, in the array, the value of the resistance (or conductance) of each node determines the coupling between nodes, where a node is represented by an RPU device in the array. Further, upon training the crosspoint array according to the ANN, the resistance (or conductance) will be different from device to device, depending on the desired coupling. For training a neural network, it is necessary to actively adjust the resistance values. Once the training is complete, the resistance values remain fixed during operation of the crosspoint array circuit, until training begins for a new task.

In one or more examples, it is desirable to program the ANN once, and keep the fixed operation indefinitely. For example, this provides more robust operation, and security, compared to reprogramming the ANN repeatedly, among other advantages. For example, it can be desirable to permanently program or train a crosspoint array that implements an ANN for an automotive application that recognizes a pedestrians to eliminate the possibility of a mistake. For pre-programmed neural networks, the resistance values can be computed once, and then these values permanently imprinted into one or more devices.

Described here are technical solutions for realizing such a cross-point array using lithography.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop. The term "about" is intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having closely packed vertical transistors with reduced contact resistance according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. A wet etch process, such as a buffered hydrofluoric acid (BHF) etch, is a material removal process that uses liquid chemicals or etchants to remove materials from a surface. A dry etch process, such as reactive ion etching (RIE), uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

In one or more embodiments, the resistive elements are formed using semiconductor strips, such as polysilicon. The strips can be doped, to control the resistivity of the semiconductor. Typically, the resistance value can be varied using strips of different dimensions. However, the conventional method can include tailoring multiple lithographic masks to ensure that contacts are made with the ends of the strips. The technical solutions described herein facilitate using only one masking step that configures the resistance values, so that altering the programmed values is a simple matter of substituting a single mask, when the array is to be reprogrammed.

The technical solutions described herein use semiconducting-strips of identical length for all of the resistive elements in the crosspoint array, which are masked based on metallic shunts of varying length that selectively adjust the resistance of the strips, respectively.

Turning now to an overview of aspects of the present invention, one or more embodiments provide methods of fabricating a semiconductor device having a crosspoint array that includes multiple crosspoint devices with metallic shunts of varying length that selectively adjust the resistance of the crosspoint devices respectively. In one or more embodiments, optical lithography and/or electron beam lithography is used followed by selective plasma etching for fabricating the crosspoint array that includes multiple crosspoint devices with metallic shunts of varying length that selectively adjust the resistance of the crosspoint devices respectively. In one or more embodiments, the shunt metal can be lithographically patterned and etched. Methods for fabricating the semiconductor device with above described characteristics and the resulting structures therefrom in accordance with embodiments of the present invention are described in detail below by referring to the accompanying drawings in FIGS. 7-14.

Figure 7:
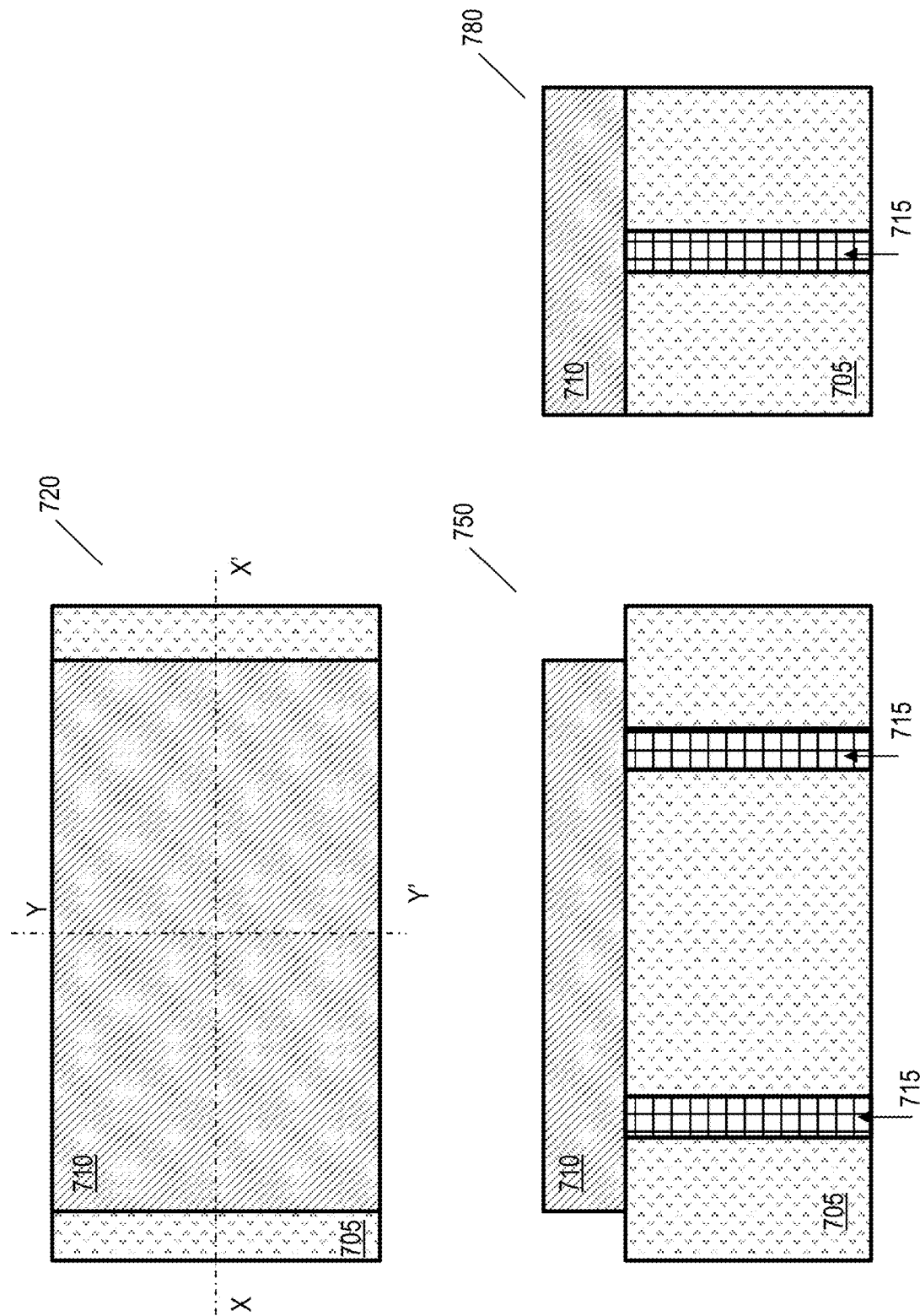
FIG. 7 illustrates views of a structure during an intermediate operation of a method of fabricating the semiconductor crosspoint array according to one or more embodiments.

FIG. 7 illustrates a top-view 720, a cross-sectional view 750, and a side view 780 of a structure 700 during an intermediate operation of a method of fabricating the semiconductor crosspoint array according to one or more embodiments. The structure 700 depicts a portion of the crosspoint array. The structure 700 includes a single crosspoint device of the crosspoint array. The cross-sectional view 750 is depicted along the line X-X' and the side view of 780 is depicted along the line Y-Y' illustrated in the top view 720 of the structure 700.

FIG. 7 depicts the structure 700 after forming an insulating layer, or an interlayer dielectric (ILD) 705. Any known manner of forming the ILD 705 can be utilized. In some embodiments, the ILD 705 is deposited by a spin-on coating operation. The ILD 705 can be any suitable dielectric material, such as, for example, an oxide. The ILD 705 can be composed of a dielectric material that is selected from the group consisting of aluminum oxide ($Al_2O_3$), magnesium oxide (MgO), boron nitride (BN), silicon oxynitride ($SiO_xN_y$), silicon oxide ($SiO_2$), and combinations thereof.

The structure 700 further includes conductive contacts 715, such as metal vias, which are formed in the ILD 705. The conductive contacts 715 can be composed of any electrically conductive material. A "conductive contact" (or a terminal) as used to describe a component of the crosspoint devices represents one of the two electrically conductive materials of the crosspoint device. The conductive contacts 715 are on opposing sides and separated by the ILD 705. "Electrically conductive" as used through the present description means a material typically having a room temperature conductivity of greater than $10\text{-}8$ $(\Omega\text{-m})^{-1}$.

The conductive contacts 715 can be of any suitable conducting material, such as, for example, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials.

Any known manner of forming the conductive contacts 715 can be utilized. In some embodiments, vias are formed in the ILD 705 and the conductive contacts 715 are deposited in the vias (not illustrated). In one or more examples the trenches are formed instead of the vias. The examples herein use vias, however it would be clear to a person skilled in the art how a trench can be used instead of a via. For example, if the conductive contacts 715 are of metal, such as copper, and include a barrier metal liner, the barrier metal liner is deposited into the vias prior to depositing the contacts into the vias. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

In one or more embodiments, the conductive contacts 715 can be deposited in vias made in the ILD 705 using a physical vapor deposition (PVD) process. Examples PVD processes that are suitable for forming the conductive contacts 715 include plating, sputtering, electroplating, electrophoretic deposition, and combinations thereof. In other embodiments, the conductive material can be deposited using a chemical vapor deposition process, such as plasma enhanced chemical vapor deposition (PECVD). In some embodiments, the material of the first electrode 14 can be an electrically conductive semiconductor, such as n-type doped polysilicon. The conductive material can further include dopants that are incorporated during or after deposition.

Following deposition of the material for the conductive contacts 715 in the vias of the ILD 705, a planarization process, such as chemical mechanical planarization (CMP) can be used to planarize the upper surface of the electrically conductive material that is present in the vias. In some embodiments, the planarization process can continue until the upper surface of the electrically conductive material that provides the conductive contacts 715 within the vias is coplanar with the upper surface of the portion of the ILD 705 that is not etched. Optionally, a capping layer (not shown) can be disposed on the exposed surface of the conductive contacts 715. Typically, the capping layer is tantalum or a nitride thereof.

As illustrated in FIG. 7, a semiconducting layer 710 is sequentially formed on ILD 705 having the conductive contacts 715 formed. Any known composition and manner of forming the semiconducting layer 710 can be utilized. In some embodiments, the semiconducting layer 710 can be amorphous silicon (a-Si) or polycrystalline silicon (poly-Si). Thus, as illustrated, in one or more embodiments, the semiconducting layer 710 lines on top of two conductive contacts 715, one at each end of the semiconducting layer 710.

Figure 8:
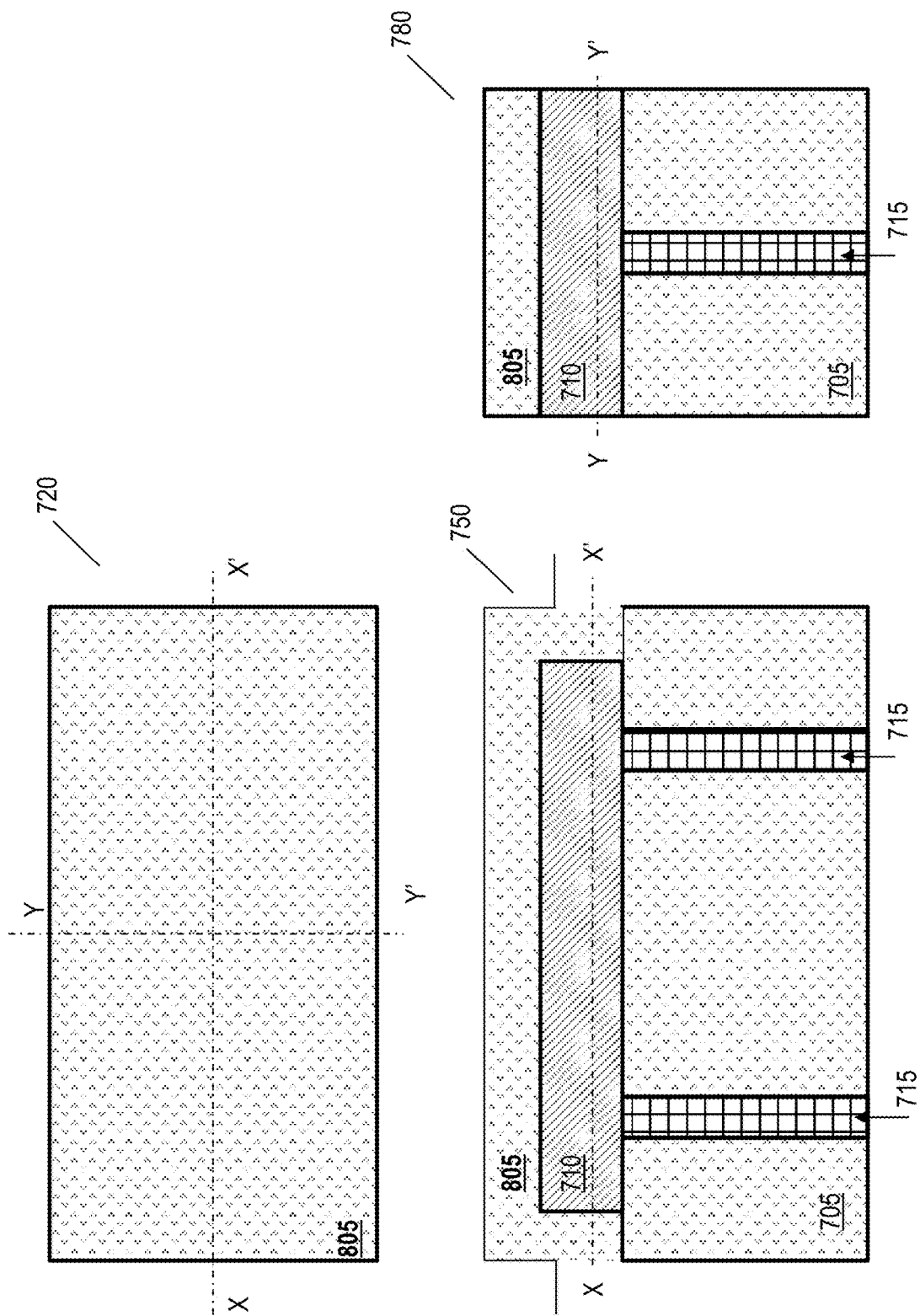
FIG. 8 illustrates views of a structure during an intermediate operation of a method of fabricating the semiconductor crosspoint array, where an insulator layer is deposited on top of a semiconducting layer according to one or more embodiments.

In one or more embodiments, the semiconducting layer 710 is sheathed between two insulating layers. FIG. 8 illustrates another ILD 805 being deposited on top of the semiconducting layer 710. Thus, the ILD 705 is a base layer and the ILD 805 is a top layer with the semiconducting layer 710 sheathed in between the two ILDs. In one or more embodiments, the ILD 805 can use the same material as the ILD 705. For example, the ILD 805 can be composed of a dielectric material that is selected from the group consisting of aluminum oxide ($Al_2O_3$), magnesium oxide (MgO), boron nitride (BN), silicon oxynitride ($SiO_xN_y$), silicon oxide ($SiO_2$), and combinations thereof. The ILD 805 can be deposited using a deposition process, including, but not limited to, PVD, CVD, PECVD, or any combination thereof. The thickness of the ILD 805 can range from 1 nm to 20 nm. In one or more embodiments, the thickness of the insulating layer 18 can range from 1 nm to 10 nm.

Figure 9:
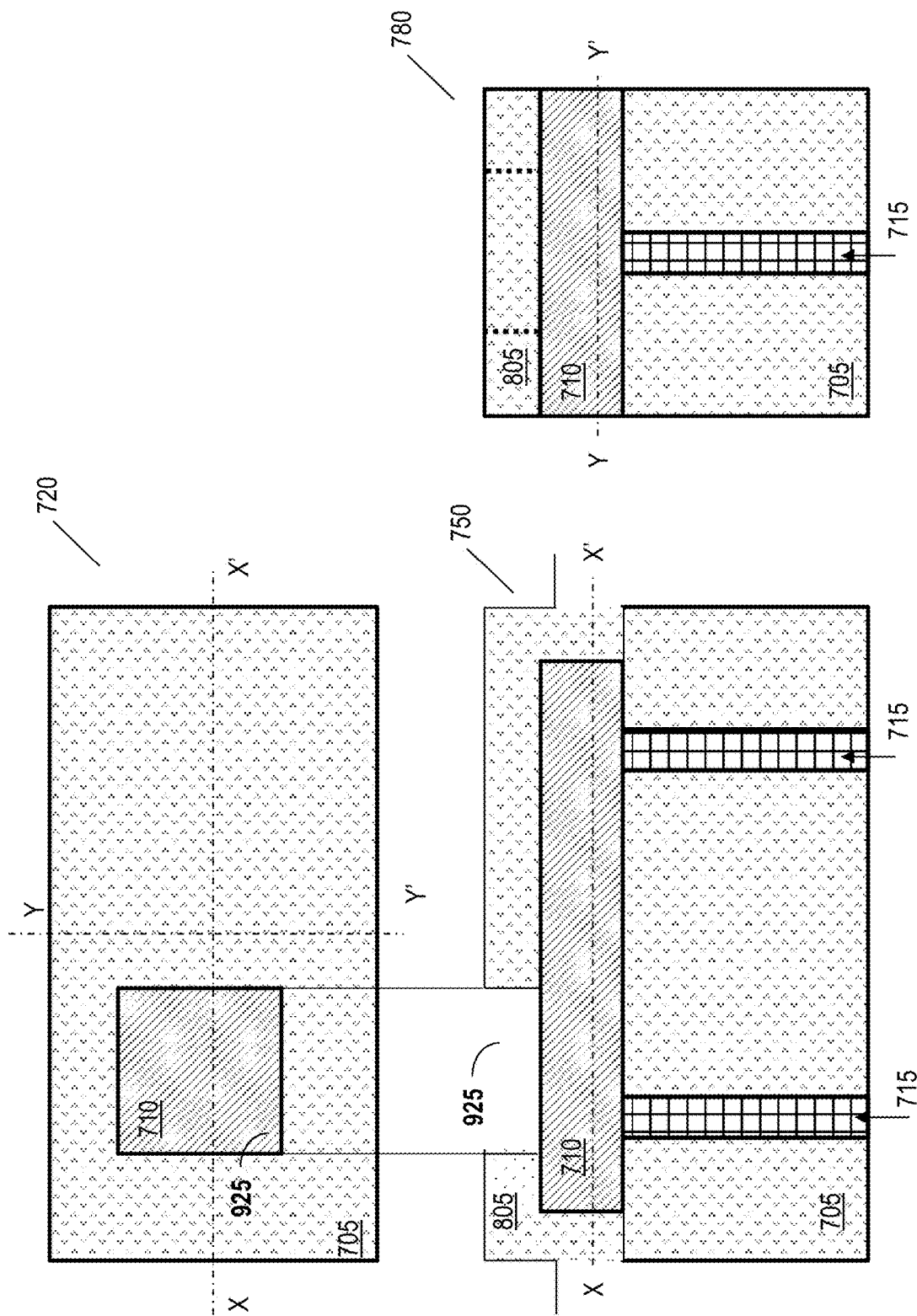
FIG. 9 illustrates views of a structure during an intermediate operation of a method of fabricating the semiconductor crosspoint array, where a portion of an insulator layer is removed according to one or more embodiments.

Further, a lithographic process is used to remove a portion 925 of the ILD 805 on top of the semiconducting layer 710. FIG. 9 illustrates the structure with the portion 925 of the ILD 805 etched. The ILD 805 can be etched using any etching process, such as wet etching, dry etching, and the like or a combination thereof. For example, a wet etch process, such as a buffered hydrofluoric acid (BHF) etch, is a material removal process that uses liquid chemicals or etchants to remove materials from a surface. A dry etch process, such as reactive ion etching (RIE), uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

In one or more embodiments, the portion 925 is removed using optical lithography, followed by selective plasma etching to stop on the semiconducting layer 710. The dimensions, such as length, area, height, or volume of the portion 925 of the ILD 805, defines how much of the semiconducting layer 710 is shunted, thus defining the resistance of the structure 100. For the highest resistance value, none of the ILD 805 is removed. For the lowest resistance value, the semiconducting layer 710 is entirely laid bare. Accordingly, in one or more embodiments, a lithographic mask is used that has areas with varying dimensions, each area corresponding to the portions of the ILD 805 to be etched.

Figure 10:
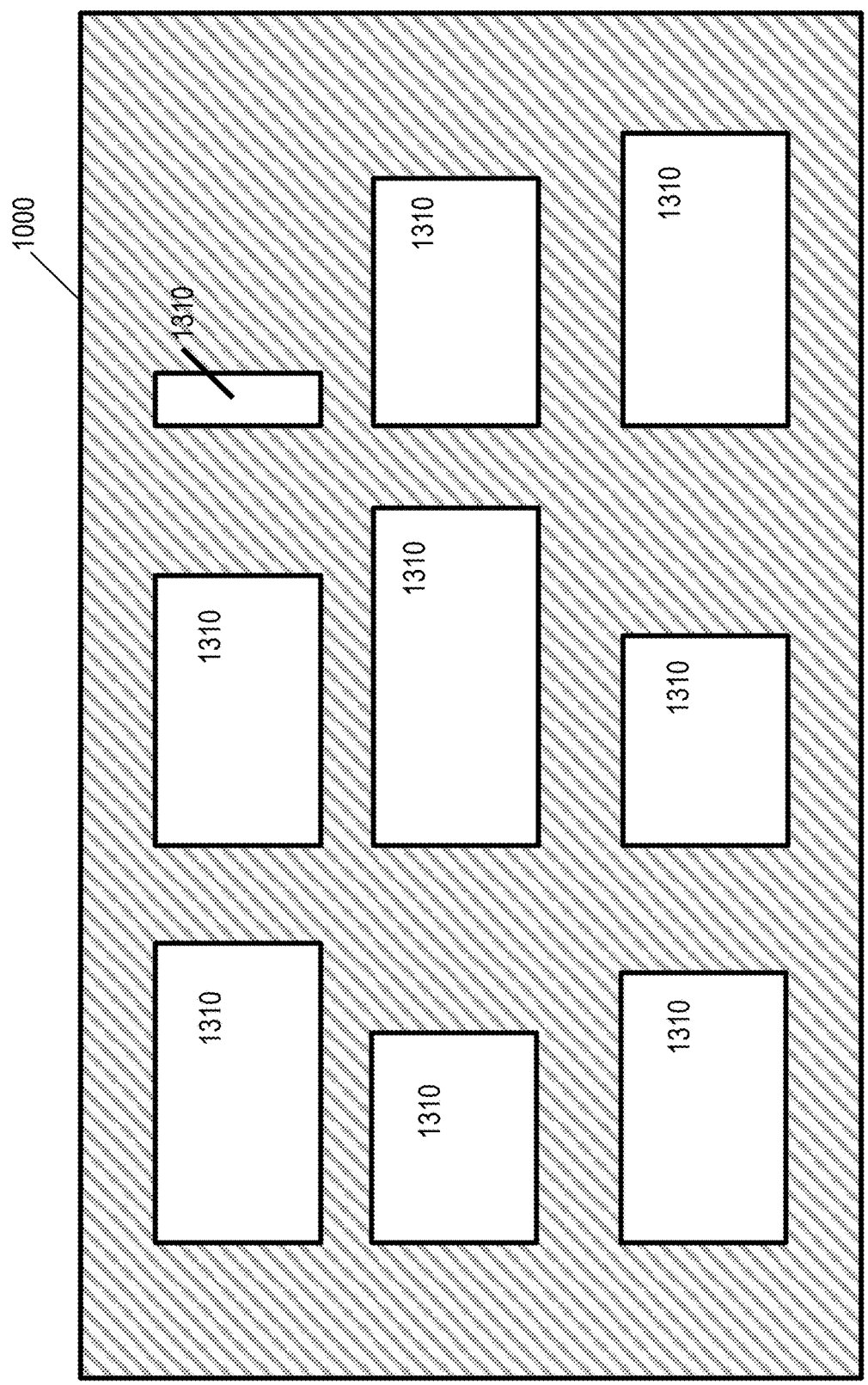
FIG. 10 illustrates a lithographic mask for removing portions of variable dimensions of an insulating layer during an intermediate operation of a method of fabricating a semiconductor crosspoint array according to one or more embodiments.

FIG. 10 illustrates an example of a lithographic mask 1000 that has areas 1010. As illustrated, the areas 1010 are of variable dimensions. For example, a first area 1010 has different length from a second area 1010. Accordingly, by using the lithographic mask 1000 to etch the ILD 805, results in a crosspoint array with crosspoint devices with etched portions 925 with different dimensions corresponding to respective areas 1010. Each of the areas 1010 of the mask 1000 corresponds to a respective structure 100.

Figure 11:
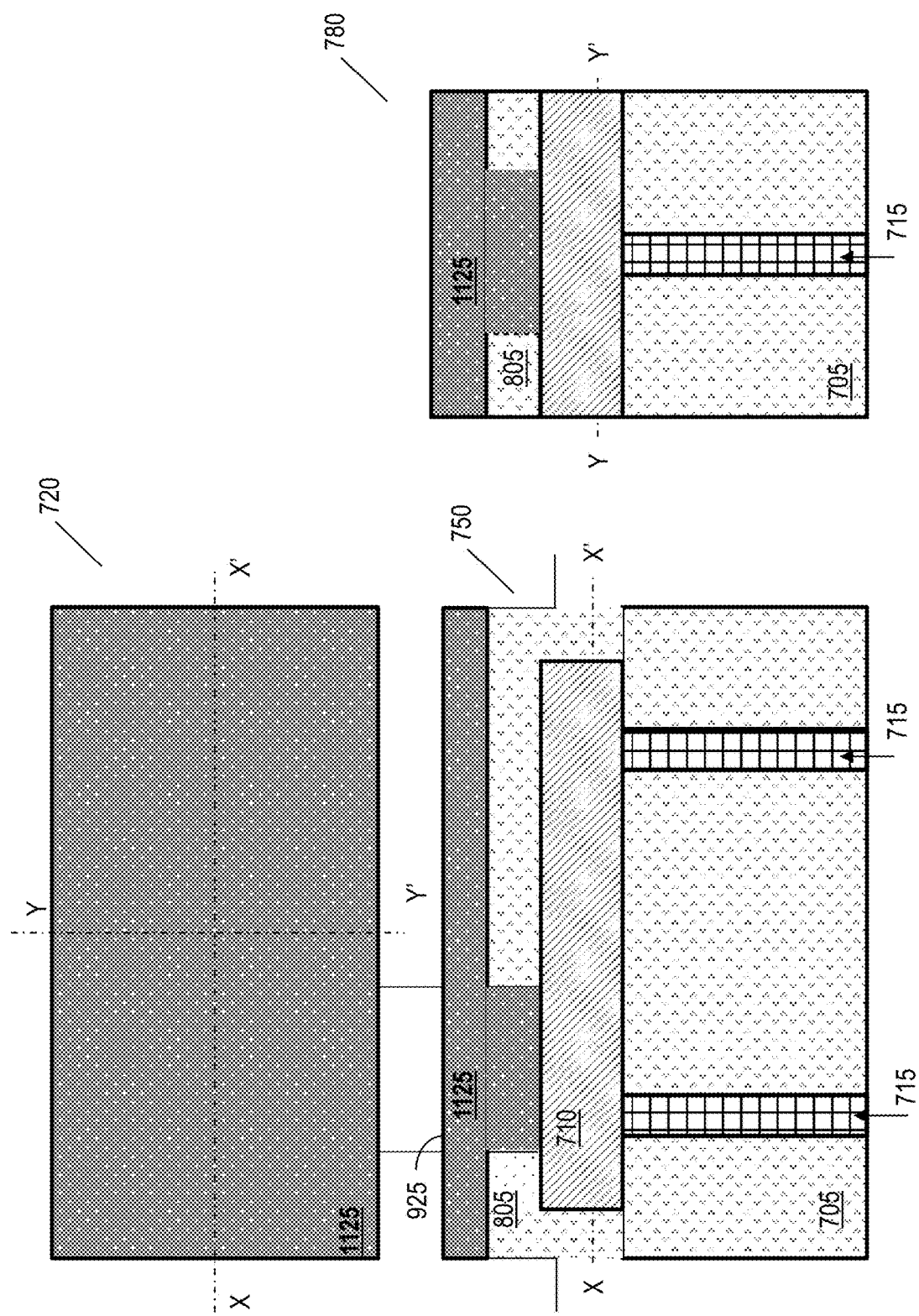
FIG. 11 illustrates views of a structure during an intermediate operation of a method of fabricating the semiconductor crosspoint array, where a shunting layer is deposited on top of an insulating layer according to one or more embodiments.

FIG. 11 illustrates one or more embodiments in which, after the portion 925 of the ILD 805 has been removed, a shunting layer 1125 is deposited on the ILD 805. The shunting layer 1125 deposits shunting material into the portion 925 that as etched from the ILD 805. The shunting material can be conductive material, such as a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. In one or more embodiments, the shunting material used for the shunting layer 1125 can be the same as the conductive material used for the conductive contacts 715. Alternatively, the shunting material used for the shunting layer 1125 can be different from the conductive material used for the conductive contacts 715. The vertical resistance through the semiconducting layer 710 to the shunting layer 1125 then determines the resistance value of the crosspoint device.

Figure 12:
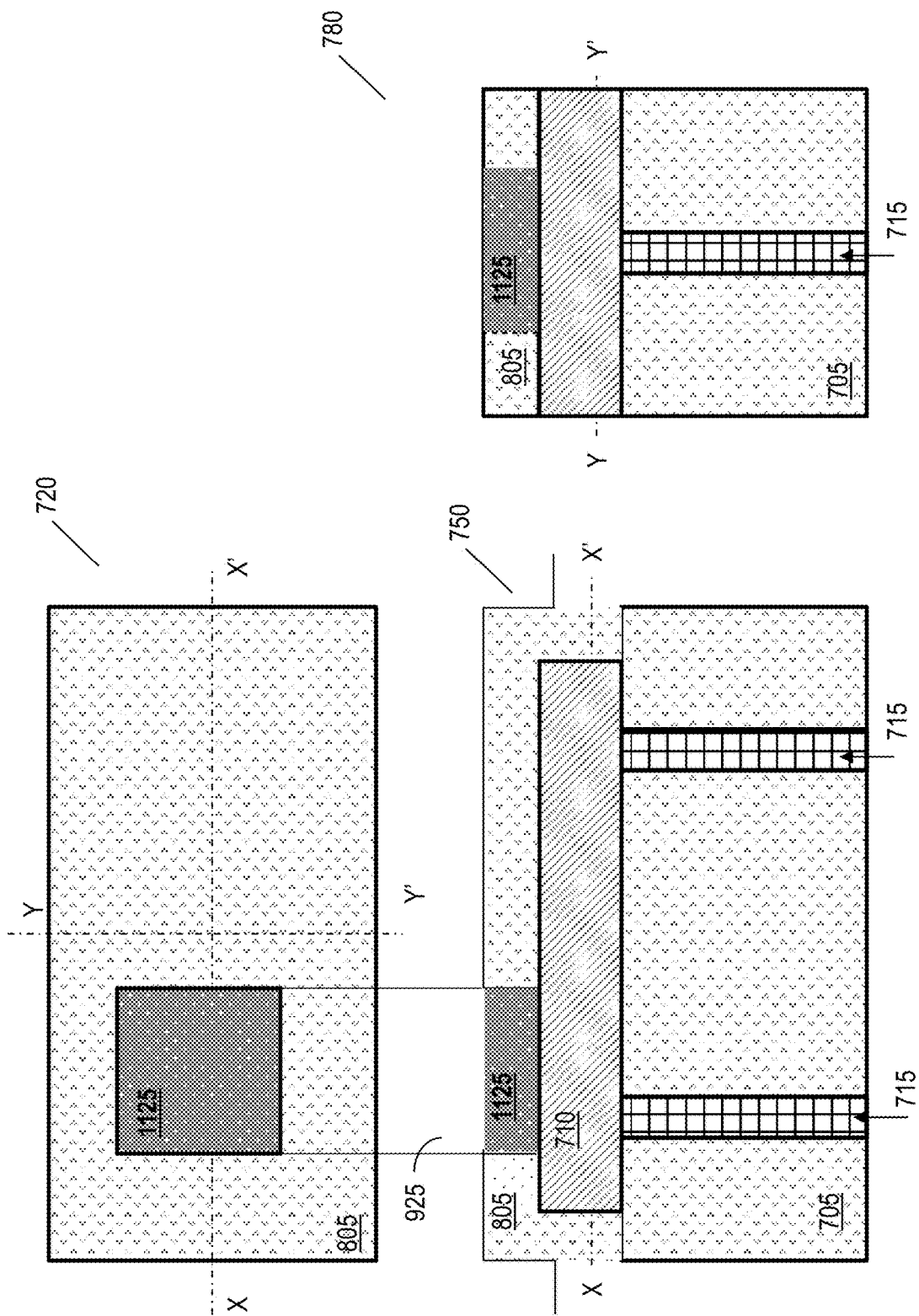
FIG. 12 illustrates views of a structure during an intermediate operation of a method of fabricating the semiconductor crosspoint array, where portions of a shunting layer are removed according to one or more embodiments.

In one or more embodiments, the shunting layer 1125 is patterned using a self-aligned silicide process (salicide). For example, the wafer is heated to cause the shunting layer 1125 to react with the semiconductor layer 710. Afterwards, unreacted shunting material is removed, which leaves the shunting layer 1125 only in the removed portion 925, as shown in FIG. 12.

Figure 13:
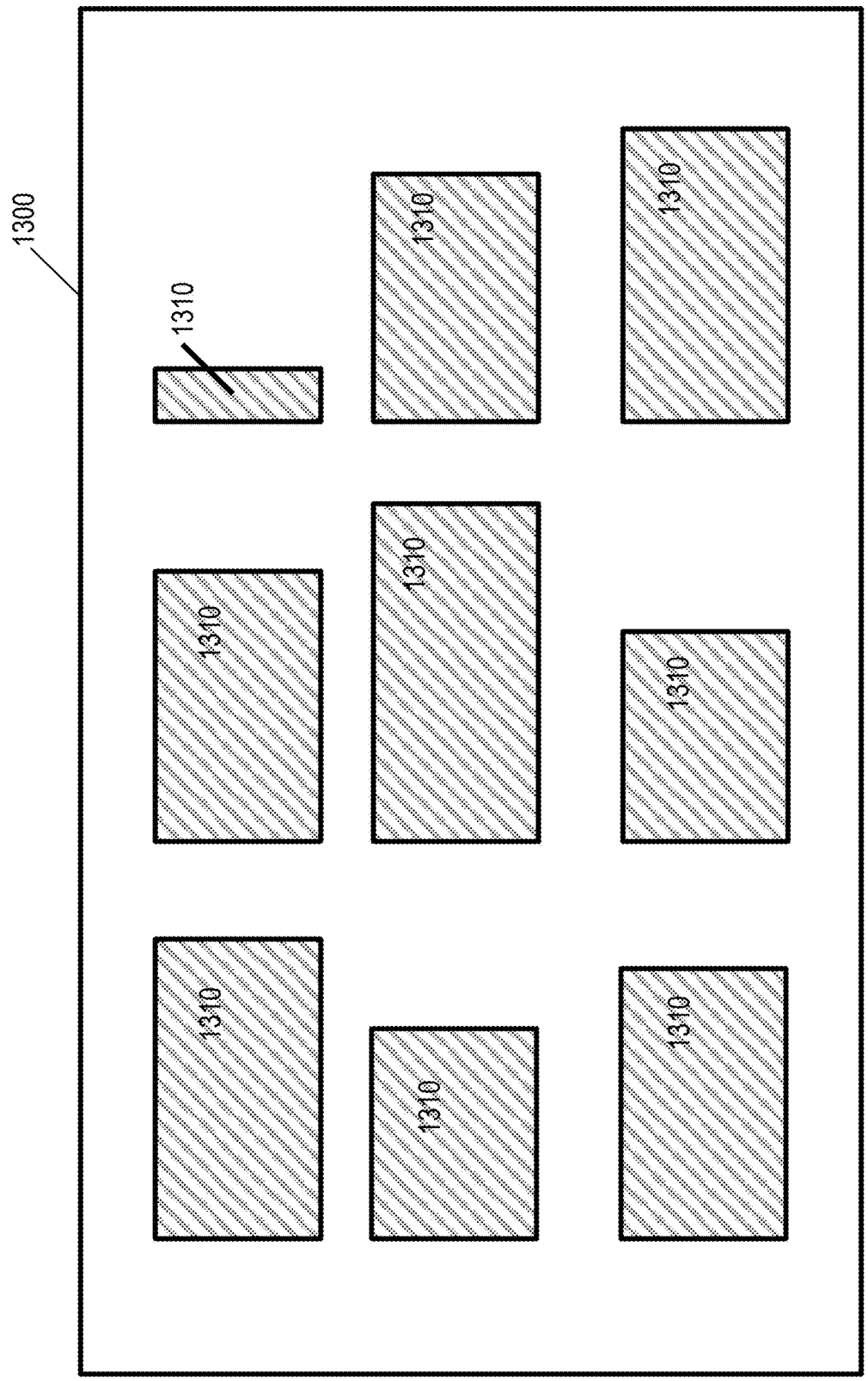
FIG. 13 illustrates a lithographic mask for removing portions of variable dimensions of a shunting layer during an intermediate operation of a method of fabricating a semiconductor crosspoint array according to one or more embodiments.

Alternatively, the shunting layer 1125 can be lithographically patterned and etched, as described herein. In one or more embodiments, this step can be done at a relatively relaxed tolerance because the only requirement is to avoid shorting adjacent devices. FIG. 13 illustrates a lithographic mask 1300 that can be used for etching the shunting layer 1125. The lithographic mask 1300 facilitates removing the shunting material except the shunting material in the portion 925. Accordingly, the lithographic mask used for etching the shunting layer 1125 is a reverse of the lithographic mask 1000, where the areas 1310 cover the shunting material in the portion 925, facilitating removal of the shunting material from the surrounding (unshaded) area. The mask 1300, which isolates the shunting material, is not tailored to the resistance values of the crosspoint devices because even if excess metal overlies the ILD 805 regions of the semiconducting layer 710, the excess does not affect the resistance (or conductance) of the crosspoint device. Each of the areas 1310 of the mask 1300 corresponds to a respective structure 100.

The technical solutions described herein facilitate fabricating a semiconductor device for a crosspoint array with preprogrammed resistance values to implement a neural network using multiple crosspoint devices of the crosspoint array. The crosspoint array fabricated using technical solutions described herein is a matrix of crosspoint resistors. The technical solutions facilitate a fabrication process, which can control the resistance of the crosspoint devices with sufficient accuracy for a functional neural network, by facilitating up to +−50 nm accuracy in defining the length of a shunt, which is the shunting material left in the portion 925.

Figure 14:
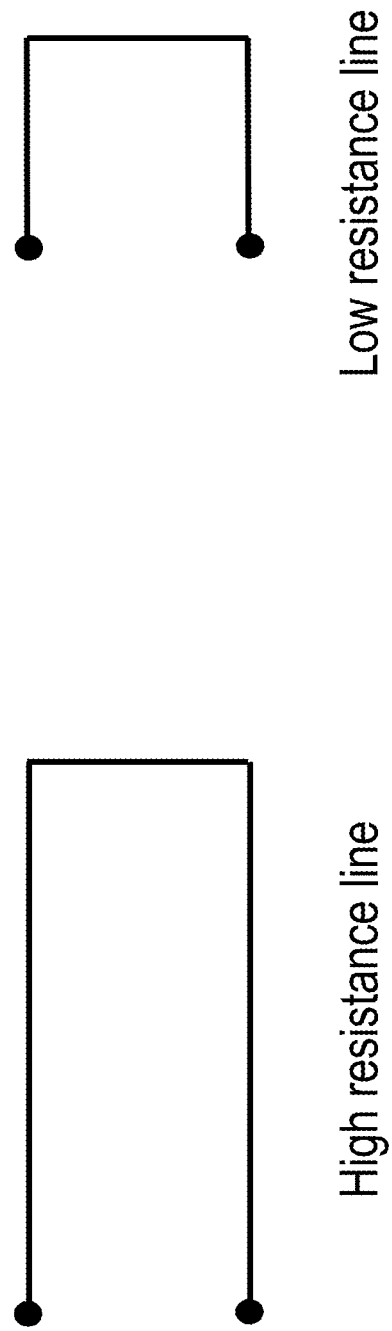
FIG. 14 illustrates example shapes of semiconducting strips used during fabricating a semiconductor crosspoint array according to one or more embodiments.

In one or more embodiments, for optimization of wiring, it is desirable to have the resistor contacts in close proximity. This can be implemented by forming the semiconductor layer 710 in a path with one or multiple bends. For example, a "U" or "V" shape to locate the two contacts (endpoints) in close proximity. Accordingly, in one or more embodiments the areas 1010 of the lithographic mask 1000 are U or V shaped to facilitate etching the ILD 805 correspondingly. FIG. 14 illustrates the semiconducting strips arranged in a "U" pattern with contacts in close proximity. Further, the length of the 'U' shaped strip is varied using the areas 1010 of the lithographic mask 1000. The different length of the strips facilitates varying the resistance values of the corresponding crosspoint devices in the crosspoint array. As shown in the FIG. 11, the path length can be altered using the mask for polysilicon patterning without affecting any other layers of the device. It is understood, that different shapes, such as a more meandering paths can be implemented in other embodiments, depending on a trade-off between creating corners that are potential leakage points and increasing the array density. It is further understood that the masks 1000 and 1300 that are illustrated can have a different number of areas than those illustrated in FIG. 10 and FIG. 13, respectively.

In one or more embodiments, resistance values of the crosspoint devices are paired to represent negative and positive values of the weights. In this case, the structure can be fabricated to have two layers of resistive material, with a first strip denoting negative weight above or below a second strip denoting positive weight.

Furthermore, one or more embodiments can include a diode to prevent sneak-path currents. For example, the diode is included in the substrate and included in the crossbar array. In one or more embodiments, the diode is placed in series with the resistive path.

The technical solutions described herein, thus facilitate, fabricating semiconductor device for a resistive crossbar array composed of semiconducting strips whose resistance value is controlled by a shunting element. The fabricated crosspoint array includes multiple semiconductor devices that are crosspoint devices described herein, such as RPUs, with varying resistance values, which are preprogrammed according to a trained neural network.

The semiconductor device can use silicon, germanium or a compound semiconductor for a semiconducting layer. In one or more examples, the semiconducting layer can include a dopant to control the resistivity.

In one or more embodiments, the semiconductor is sheathed with an insulating layer, defining the region contacted by the shunt. The insulating layer can be silicon oxide, nitride, or a combination of the two. In one or more embodiments, contacts are also made with the ends of the semiconducting strip.

Depositing the shunting layer can be performed using a salicide process, wherein the shunting layer is a reacted layer in a self-aligned configuration. For example, the reacted layer can be a silicide or germanide of titanium, nickel, cobalt platinum or other metal. Alternatively, the shunting layer can also be a metal that is patterned so as not to contact other elements in the crossbar array. The resistance of the fabricated crosspoint device is the vertical resistance through the semiconducting layer 710 to the shunt.

The technical solutions described herein facilitate varying resistances of the crosspoint devices, for example up to a maximum resistance value of 24 M-Ohm. For example, a strip of 1 micron length, and 0.1 micron width and height, formed using a material with a resistivity of 24 Ohm-cm results in the 24 M-Ohm resistance. It is understood that embodiments can be implemented with different materials of different resistivity, and/or different dimensions to achieve the pre-programmed weights according to the trained neural network.

The present technical solutions may be a system, a method, and/or a computer program product at any possible technical detail level of integration. The computer program product may include a computer readable storage medium (or media) having computer readable program instructions thereon for causing a processor to carry out aspects of the present technical solutions.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present technical solutions may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present technical solutions.

Aspects of the present technical solutions are described herein with reference to flowchart illustrations and/or block diagrams of methods, apparatus (systems), and computer program products according to embodiments of the technical solutions. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present technical solutions. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

A second action may be said to be "in response to" a first action independent of whether the second action results directly or indirectly from the first action. The second action may occur at a substantially later time than the first action and still be in response to the first action. Similarly, the second action may be said to be in response to the first action even if intervening actions take place between the first action and the second action, and even if one or more of the intervening actions directly cause the second action to be performed. For example, a second action may be in response to a first action if the first action sets a flag and a third action later initiates the second action whenever the flag is set.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are to be construed in the broadest sense, superseding any other implied definitions hereinbefore or hereinafter unless expressly asserted to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

It will also be appreciated that any module, unit, component, server, computer, terminal or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Such computer storage media may be part of the device or accessible or connectable thereto. Any application or module herein described may be implemented using computer readable/executable instructions that may be stored or otherwise held by such computer readable media.

The descriptions of the various embodiments of the present technical solutions have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments described herein.

What is claimed is:

1. A semiconductor device comprising:
   a base insulating layer;
   a first set of conductive contacts for a first resistive device, the first set of conductive contacts extending through the base insulating layer;
   a second set of conductive contacts for a second resistive device, the second set of conductive contacts extending through the base insulating layer;
   a semiconducting layer deposited on a top surface of the base insulating layer, a first surface of the semiconducting layer in contact with the first set and the second set of conductive contacts;
   a top insulating layer deposited on a second surface and opposite sidewalls of the semiconducting layer, the top insulating layer comprising at least two portions that expose the second surface of the semiconducting layer, a first portion and a second portion, wherein a length of the first portion along the exposed second surface of the semiconducting layer is different from a length of the second portion, wherein the first portion is associated with the first resistive device and the second portion is associated with the second resistive device, and wherein a bottom surface of the top insulating layer is formed directly on the top surface of the base insulating layer; and
   a shunting layer deposited directly on the second surface of the semiconducting layer, the shunting layer comprising a first portion having a first area and a second portion having a second area different than the first area, the first portion isolated from the second portion by the top insulating layer, the shunting layer being deposited inside a removed portion of the top insulating layer without penetration above a top surface of the top insulating layer, a thickness of the shunting layer being equal to a thickness of the top insulating layer, and the shunting layer configured to reduce a resistance between a first contact and a second contact of the first set of conductive contacts across the semiconducting layer.

2. The semiconductor device of claim 1, wherein the insulating layer comprises a dielectric material that is selected from a group consisting of aluminum oxide (Al2O3), magnesium oxide (MgO), boron nitride (BN), silicon oxynitride (SiOxNy), and silicon oxide (SiO2).

3. The semiconductor device of claim 1, wherein the shunting layer comprises shunting material that reacts with semiconducting material of the semiconducting layer in response to applying heat.

4. The semiconductor device of claim 1, wherein a shunting material for the shunting layer is selected from a group consisting of silicides of titanium, nickel, cobalt, and platinum, and germanides of titanium, nickel, cobalt, and platinum.

5. A semiconductor device comprising:
a base insulating layer;
a first set of conductive contacts for a first resistive device, the first set of conductive contacts extending through the base insulating layer;
a second set of conductive contacts for a second resistive device, the second set of conductive contacts extending through the base insulating layer; and
sequentially deposited layers on the base insulating layer, the sequentially deposited layers comprising a semiconducting layer, a top insulating layer, and a shunting layer, the semiconducting layer deposited on a top surface of the base insulating layer, the top insulating layer deposited on a second surface and opposite sidewalls of the semiconducting layer, wherein a bottom surface of the top insulating layer is formed directly on the top surface of the base insulating layer,
wherein a first surface of the semiconducting layer is in contact with the first set and second set of conductive contacts,
wherein the top insulating layer is on a second surface of the semiconducting layer, the top insulating layer patterned to expose a first portion and a second portion of the second surface of the semiconducting layer, the first portion having a length greater than the second portion,
wherein the shunting layer is directly on the exposed first portion and the exposed second portion of the second surface of the semiconducting layer, a length of the shunting layer corresponding to a respective predetermined weight value from a plurality of weights of a crossbar that implements a neural network, the shunting layer providing resistance values associated with the plurality of weights of the crossbar that implements the neural network,
wherein the shunting layer comprises a first portion having a first area and a second portion having a second area different than the first area, the first portion isolated from the second portion by the top insulating layer, the shunting layer configured to reduce a resistance between a first contact and a second contact of the first set of conductive contacts across the semiconducting layer,
wherein the shunting layer is deposited inside a removed portion of the top insulating layer without penetration above a top surface of the top insulating layer, a thickness of the shunting layer is equal to a thickness of the top insulating layer, and
wherein between the first resistive device and the second resistive device is a barrier portion.

6. The semiconductor device of claim 5, wherein the top insulating layer comprises a dielectric material that is selected from a group consisting of aluminum oxide (Al2O3), magnesium oxide (MgO), boron nitride (BN), silicon oxynitride (SiOxNy), and silicon oxide (SiO2).

7. The semiconductor device of claim 5, wherein the shunting layer comprises shunting material that reacts with semiconducting material of the semiconducting layer.

8. The semiconductor device of claim 7, wherein a shunting material of the shunting layer reacts with the semiconducting material in response to applying heat.

9. The semiconductor device of claim 7, wherein a shunting material for the shunting layer is selected from a group consisting of silicides of titanium, nickel, cobalt, and platinum, and germanides of titanium, nickel, cobalt, and platinum.

* * * * *